(12) United States Patent
Galal et al.

(10) Patent No.: US 10,326,405 B2
(45) Date of Patent: Jun. 18, 2019

(54) CLASS-H SWITCHING AMPLIFIER CIRCUIT HAVING SUPPLY VOLTAGE PROPORTIONAL TO AN AUDIO SIGNAL

(71) Applicant: QUALCOMM INCORPORATED, San Diego, CA (US)

(72) Inventors: Sherif Galal, Irvine, CA (US); Subbarao Surendra Chakkirala, San Jose, CA (US); Khaled Abdelfattah, Laguna Hills, CA (US); Earl Schreyer, Carlsbad, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/598,389

(22) Filed: May 18, 2017

(65) Prior Publication Data

US 2018/0337637 A1 Nov. 22, 2018

(51) Int. Cl.
*H03F 1/02* (2006.01)
*H03F 3/185* (2006.01)
*H03F 3/217* (2006.01)
*H04R 3/04* (2006.01)
*H03F 3/181* (2006.01)

(52) U.S. Cl.
CPC ......... *H03F 1/0216* (2013.01); *H03F 1/0233* (2013.01); *H03F 3/181* (2013.01); *H03F 3/185* (2013.01); *H03F 3/217* (2013.01); *H03F 3/2175* (2013.01); *H04R 3/04* (2013.01); *H03F 2200/03* (2013.01); *H03F 2200/351* (2013.01); *H03F 2200/504* (2013.01); *H03F 2200/555* (2013.01)

(58) Field of Classification Search
CPC .................................................... H03F 1/0216
See application file for complete search history.

(56) References Cited

U.S. PATENT DOCUMENTS

| 9,041,468 | B2 | 5/2015 | Krabbenborg et al. |
| 9,098,099 | B2 | 8/2015 | Park et al. |
| 9,319,495 | B2 * | 4/2016 | D'Souza ............. H04M 1/0202 |
| 9,853,602 | B2 * | 12/2017 | Waller, Jr. ............. H03F 1/0238 |
| 2006/0043942 | A1 | 3/2006 | Cohen |
| 2010/0014694 | A1 * | 1/2010 | French .................. H03F 1/0227 381/120 |

(Continued)

FOREIGN PATENT DOCUMENTS

| EP | 2056451 A2 | 5/2009 |
| EP | 2704319 A1 | 3/2014 |

OTHER PUBLICATIONS

Chen S-H., et al., "A Class-D Amplifier Powered by Embedded Single-Inductor Bipolar-Output Power Module with Low Common Noise and Dynamic Voltage Boosting Technique", IEEE, 40th European Solid State Circuits Conference (ESSCIRC), 2014, pp. 315-318.

(Continued)

*Primary Examiner* — Patricia T Nguyen
(74) *Attorney, Agent, or Firm* — Smith Tempel Blaha LLC/Qualcomm

(57) ABSTRACT

An amplifier circuit includes an amplifier and a voltage boost circuit configured to provide a variable supply voltage to the amplifier, the variable supply voltage continuously proportional to an audio input signal, the variable supply voltage configured to follow an output of the amplifier.

27 Claims, 14 Drawing Sheets

(56) References Cited

U.S. PATENT DOCUMENTS

| | | |
|---|---|---|
| 2011/0050349 A1* | 3/2011 | Strickland ............ H03F 1/0211 |
| | | 330/297 |
| 2014/0210559 A1 | 7/2014 | Mathe et al. |
| 2015/0030183 A1 | 1/2015 | Pazhayaveetil et al. |
| 2016/0126907 A1 | 5/2016 | Moles |

OTHER PUBLICATIONS

International Search Report and Written Opinion—PCT/US2018/027212—ISA/EPO—Jul. 3, 2018 (163903WO).

* cited by examiner

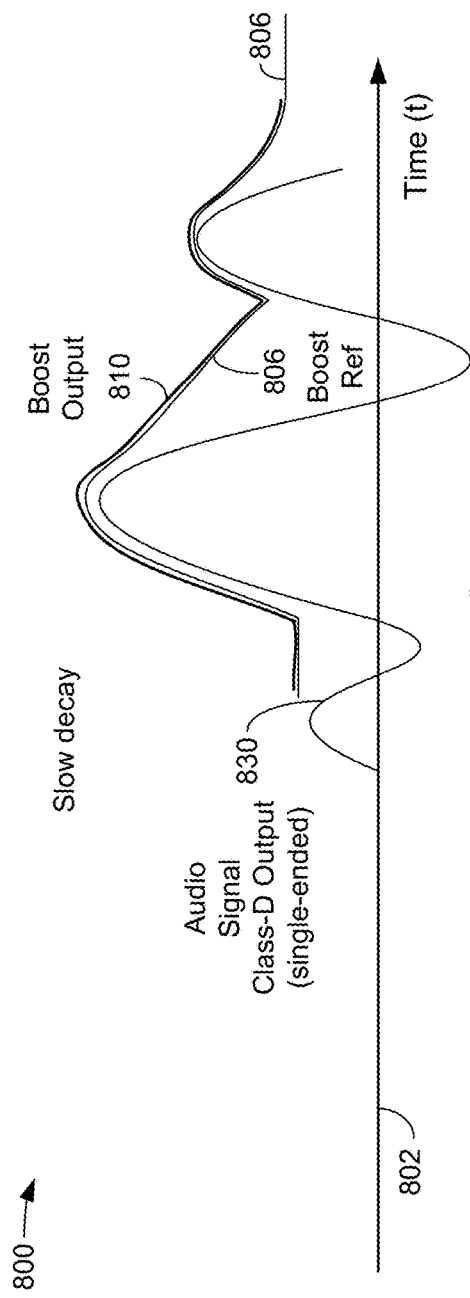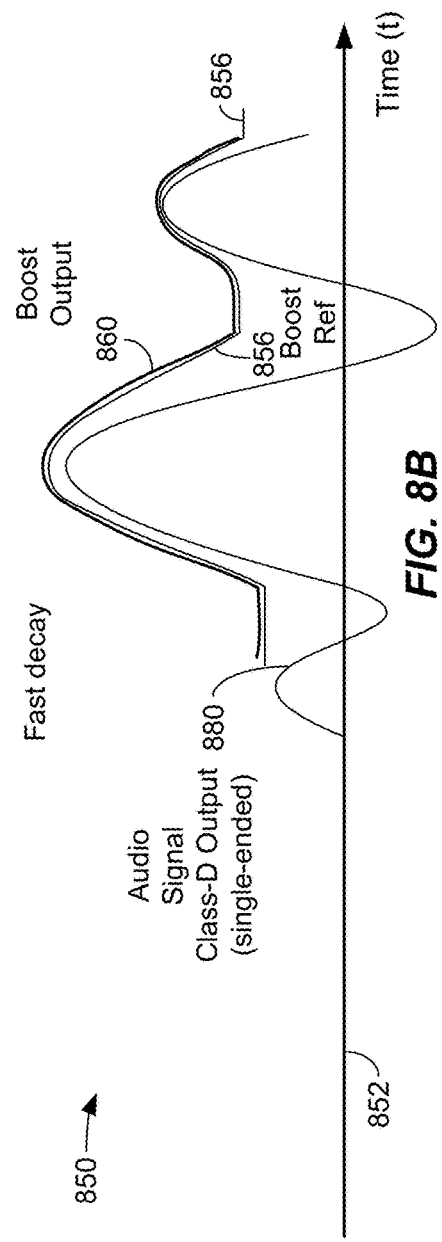
FIG. 8A
FIG. 8B

US 10,326,405 B2

CLASS-H SWITCHING AMPLIFIER CIRCUIT HAVING SUPPLY VOLTAGE PROPORTIONAL TO AN AUDIO SIGNAL

FIELD

The present disclosure relates generally to electronics, and more specifically to amplifiers.

BACKGROUND

A Class-D amplifier has very high efficiency, and is often used to amplify an audio signal in a portable communication device having a speaker. High speaker output volume in a portable communication device is generally desirable; however, providing higher volume requires a power supply voltage that often exceeds the maximum voltage of modern power sources. For example, a lithium-ion battery typically is limited to a five (5) volt (V) maximum voltage output, while a class-D amplifier used to provide an audio signal to a speaker generally requires a voltage that exceeds 5V, particularly at higher volume output levels. To accommodate the higher voltage output, a boost circuit can be coupled to the Class-D amplifier and can be configured to raise the supply voltage above 5V to power the class-D amplifier to provide higher volume output levels. At lower volume output levels, the boost circuit may operate in what is referred to as a "bypass mode", thereby preserving the efficiency of the class-D amplifier. At higher power levels, the boost circuit can provide additional supply voltage to the class-D amplifier so that the class-D amplifier may provide higher speaker volume. However, at higher levels of supply voltage, the efficiency of the combination of the boost circuit and the class-D amplifier typically degrades, particularly as power levels increase and the class-D amplifier spends less time in bypass mode. Therefore, it would be desirable to have a boost circuit and class-D amplifier that allows periodic higher volume output and that maintains the efficiency of the class-D amplifier over a wide range of power output levels.

SUMMARY

Various implementations of systems, methods and devices within the scope of the appended claims each have several aspects, no single one of which is solely responsible for the desirable attributes described herein. Without limiting the scope of the appended claims, some prominent features are described herein.

Details of one or more implementations of the subject matter described in this specification are set forth in the accompanying drawings and the description below. Other features, aspects, and advantages will become apparent from the description, the drawings, and the claims. Note that the relative dimensions of the following figures may not be drawn to scale.

One aspect of the disclosure provides a circuit including an amplifier circuit having an amplifier and a voltage boost circuit configured to provide a variable supply voltage to the amplifier, the variable supply voltage continuously proportional to an audio input signal, the variable supply voltage configured to follow an output of the amplifier. In one implementation, the amplifier comprises a class-D amplifier.

Another aspect of the disclosure provides a device including means for amplifying an audio input signal, and means for providing a variable supply voltage to the amplifying means, the variable supply voltage continuously proportional to an audio input signal, the variable supply voltage configured to follow an output of the amplifying means.

Another aspect of the disclosure provides a method for operating an amplifier including amplifying an audio input signal, and providing a variable supply voltage for amplifying the audio input signal, the variable supply voltage continuously proportional to an audio input signal, the variable supply voltage configured to follow an amplified audio output signal.

BRIEF DESCRIPTION OF THE DRAWINGS

In the figures, like reference numerals refer to like parts throughout the various views unless otherwise indicated. For reference numerals with letter character designations such as "102a" or "102b", the letter character designations may differentiate two like parts or elements present in the same figure. Letter character designations for reference numerals may be omitted when it is intended that a reference numeral may encompass all parts having the same reference numeral in all figures.

FIGS. 8A and 8B are diagrams illustrating the programmable aspect of the boost circuit (FIG. 3).

DETAILED DESCRIPTION

The word "exemplary" is used herein to mean "serving as an example, instance, or illustration." Any aspect described herein as "exemplary" is not necessarily to be construed as preferred or advantageous over other aspects.

Exemplary embodiments of the disclosure are directed to an amplifier circuit including a voltage boost circuit for amplifying an audio signal and elements thereof.

Figure 1:
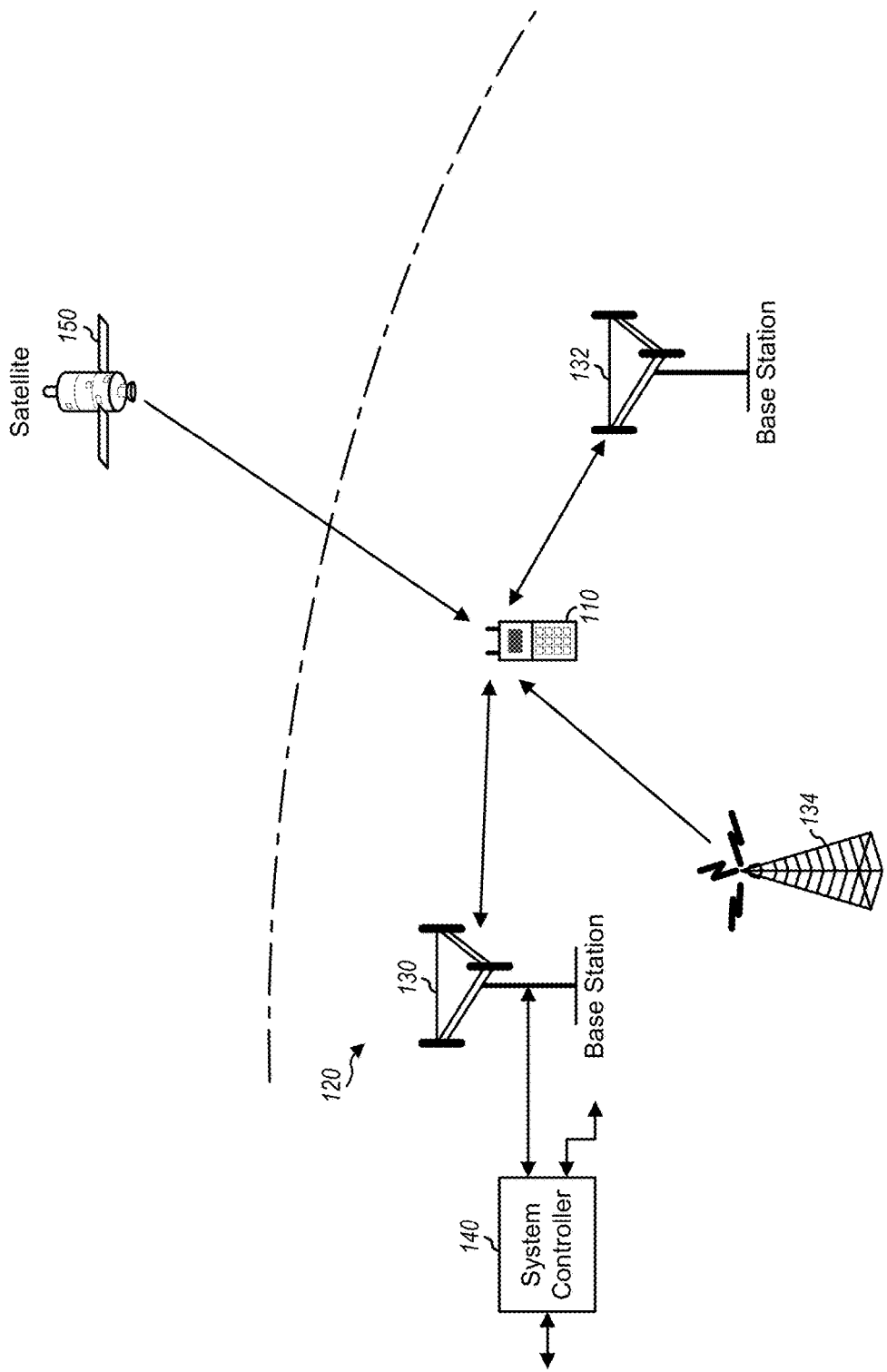
FIG. 1 is a diagram showing a wireless device communicating with a wireless communication system.

FIG. 1 is a diagram showing a wireless device 110 communicating with a wireless communication system 120. The wireless communication system 120 may be a Long Term Evolution (LTE) system, a Code Division Multiple Access (CDMA) system, a Global System for Mobile Communications (GSM) system, a wireless local area network (WLAN) system, or some other wireless system. A CDMA system may implement Wideband CDMA (WCDMA), CDMA 1×, Evolution-Data Optimized (EVDO), Time Division Synchronous CDMA (TD-SCDMA), or some other version of CDMA. For simplicity, FIG. 1 shows wireless communication system 120 including two base stations 130 and 132 and one system controller 140. In general, a wireless communication system may include any number of base stations and any set of network entities.

The wireless device 110 may also be referred to as a user equipment (UE), a mobile station, a terminal, an access terminal, a subscriber unit, a station, etc. Wireless device 110 may be a cellular phone, a smartphone, a tablet, a wireless modem, a personal digital assistant (PDA), a handheld device, a laptop computer, a smartbook, a netbook, a tablet, a cordless phone, a wireless local loop (WLL) station, a Bluetooth device, etc. Wireless device 110 may communicate with wireless communication system 120. Wireless device 110 may also receive signals from broadcast stations (e.g., a broadcast station 134), signals from satellites (e.g., a satellite 150) in one or more global navigation satellite systems (GNSS), etc. Wireless device 110 may support one or more radio technologies for wireless communication such as LTE, WCDMA, CDMA 1×, EVDO, TD-SCDMA, GSM, 802.11, etc.

Wireless device 110 may support carrier aggregation, which is operation on multiple carriers. Carrier aggregation may also be referred to as multi-carrier operation. Wireless device 110 may be able to operate in low-band (LB) covering frequencies lower than 1000 megahertz (MHz), midband (MB) covering frequencies from 1000 MHz to 2300 MHz, and/or high-band (HB) covering frequencies higher than 2300 MHz. For example, low-band may cover 698 to 960 MHz, mid-band may cover 1475 to 2170 MHz, and high-band may cover 2300 to 2690 MHz and 3400 to 3800 MHz. Low-band, mid-band, and high-band refer to three groups of bands (or band groups), with each band group including a number of frequency bands (or simply, "bands"). Each band may cover up to 200 MHz and may include one or more carriers. Each carrier may cover up to 20 MHz in LTE. LTE Release 11 supports 35 bands, which are referred to as LTE/UMTS bands and are listed in 3GPP TS 36.101. Wireless device 110 may be configured with up to five carriers in one or two bands in LTE Release 11.

In general, carrier aggregation (CA) may be categorized into two types—intra-band CA and inter-band CA. Intraband CA refers to operation on multiple carriers within the same band. Inter-band CA refers to operation on multiple carriers in different bands.

Figure 2:
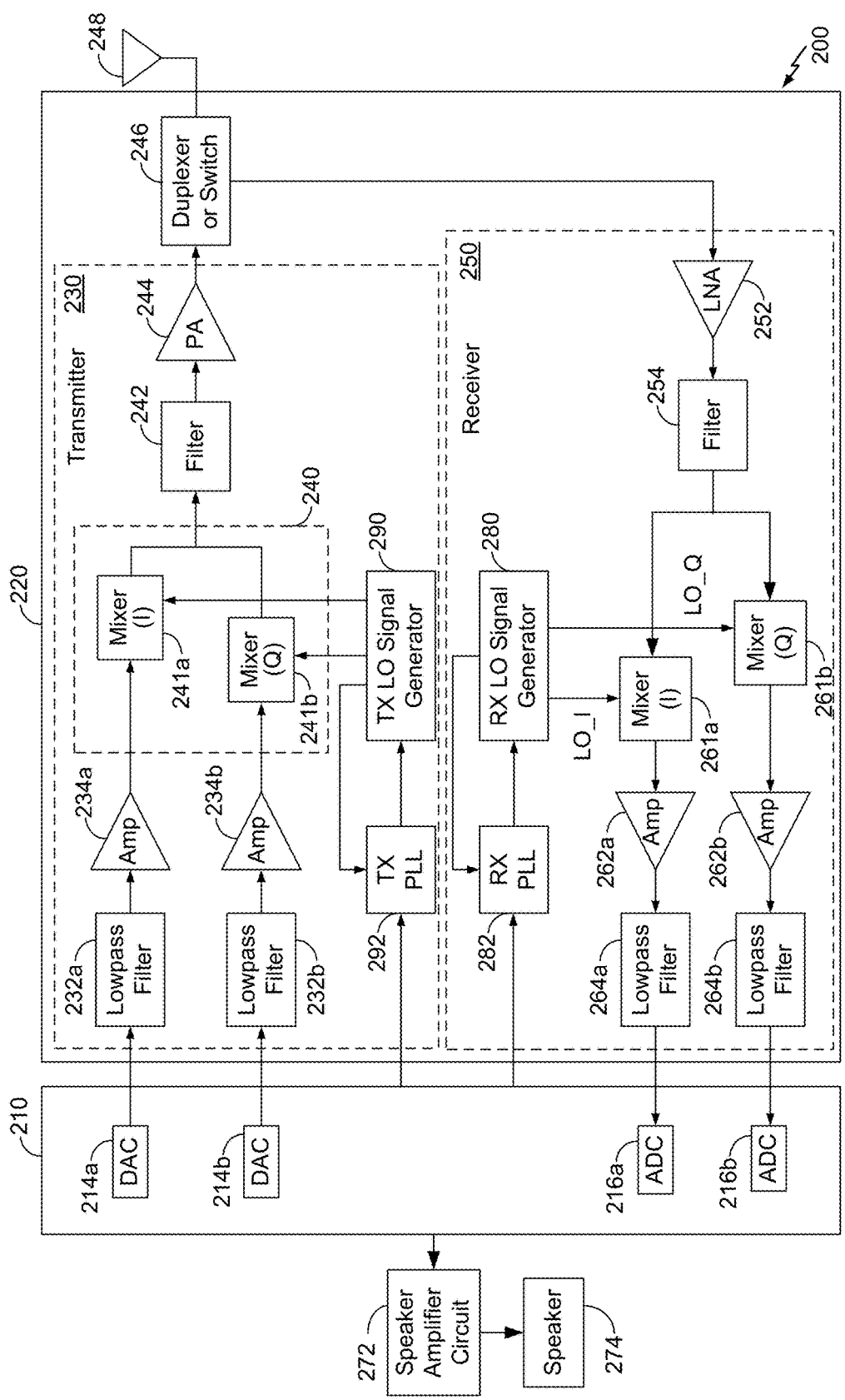
FIG. 2 is a block diagram showing a wireless device in which the exemplary techniques of the present disclosure may be implemented.

FIG. 2 is a block diagram showing a wireless device 200 in which the exemplary techniques of the present disclosure may be implemented. FIG. 2 shows an example of a transceiver 220. In general, the conditioning of the signals in a transmitter 230 and a receiver 250 may be performed by one or more stages of amplifier, filter, upconverter, downconverter, etc. These circuit blocks may be arranged differently from the configuration shown in FIG. 2. Furthermore, other circuit blocks not shown in FIG. 2 may also be used to condition the signals in the transmitter 230 and receiver 250. Unless otherwise noted, any signal in FIG. 2, or any other figure in the drawings, may be either single-ended or differential. Some circuit blocks in FIG. 2 may also be omitted.

In the example shown in FIG. 2, wireless device 200 generally comprises a transceiver 220 and a data processor 210. The data processor 210 may include a memory (not shown) to store data and program codes, and may generally comprise analog and digital processing elements. The transceiver 220 includes a transmitter 230 and a receiver 250 that support bi-directional communication. In general, wireless device 200 may include any number of transmitters and/or receivers for any number of communication systems and frequency bands. All or a portion of the transceiver 220 may be implemented on one or more analog integrated circuits (ICs), RF ICs (RFICs), mixed-signal ICs, etc.

A transmitter or a receiver may be implemented with a super-heterodyne architecture or a direct-conversion architecture. In the super-heterodyne architecture, a signal is frequency-converted between radio frequency (RF) and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the example shown in FIG. 2, transmitter 230 and receiver 250 are implemented with the direct-conversion architecture.

In the transmit path, the data processor 210 processes data to be transmitted and provides in-phase (I) and quadrature (Q) analog output signals to the transmitter 230. In an exemplary embodiment, the data processor 210 includes digital-to-analog-converters (DAC's) 214a and 214b for converting digital signals generated by the data processor 210 into the I and Q analog output signals, e.g., I and Q output currents, for further processing.

Within the transmitter 230, lowpass filters 232a and 232b filter the I and Q analog transmit signals, respectively, to remove undesired images caused by the prior digital-to-analog conversion. Amplifiers (Amp) 234a and 234b amplify the signals from lowpass filters 232a and 232b, respectively, and provide I and Q baseband signals. An upconverter 240 upconverts the I and Q baseband signals with I and Q transmit (TX) local oscillator (LO) signals from a TX LO signal generator 290 and provides an upconverted signal. A filter 242 filters the upconverted signal to remove undesired images caused by the frequency upconversion as well as noise in a receive frequency band. A power amplifier (PA) 244 amplifies the signal from filter 242 to obtain the desired output power level and provides a transmit RF signal. The transmit RF signal is routed through a duplexer or switch 246 and transmitted via an antenna 248.

In the receive path, antenna 248 receives communication signals and provides a received RF signal, which is routed through duplexer or switch 246 and provided to a low noise amplifier (LNA) 252. The duplexer 246 is designed to operate with a specific RX-to-TX duplexer frequency separation, such that RX signals are isolated from TX signals. The received RF signal is amplified by LNA 252 and filtered by a filter 254 to obtain a desired RF input signal. Downconversion mixers 261a and 261b mix the output of filter 254 with I and Q receive (RX) LO signals (i.e., LO_I and LO_Q) from an RX LO signal generator 280 to generate I and Q baseband signals. The I and Q baseband signals are amplified by amplifiers 262a and 262b and further filtered by lowpass filters 264a and 264b to obtain I and Q analog input signals, which are provided to data processor 210. In the exemplary embodiment shown, the data processor 210 includes analog-to-digital-converters (ADC's) 216a and 216b for converting the analog input signals into digital signals to be further processed by the data processor 210.

In FIG. 2, TX LO signal generator 290 generates the I and Q TX LO signals used for frequency upconversion, while RX LO signal generator 280 generates the I and Q RX LO signals used for frequency downconversion. Each LO signal is a periodic signal with a particular fundamental frequency. A phase locked loop (PLL) 292 receives timing information from data processor 210 and generates a control signal used to adjust the frequency and/or phase of the TX LO signals from LO signal generator 290. Similarly, a PLL 282 receives timing information from data processor 210 and generates a control signal used to adjust the frequency and/or phase of the RX LO signals from LO signal generator 280.

Wireless device 200 may support CA and may (i) receive multiple downlink signals transmitted by one or more cells on multiple downlink carriers at different frequencies and/or (ii) transmit multiple uplink signals to one or more cells on multiple uplink carriers. Those of skill in the art will understand, however, that aspects described herein may be implemented in systems, devices, and/or architectures that do not support carrier aggregation.

In an exemplary embodiment, the wireless device may comprise a speaker amplifier circuit 272 and a speaker 274. The speaker 274 may be configured to provide an audio output to a user of the wireless device 200. The speaker amplifier circuit 272 may comprise one or more amplifiers, amplifier systems, or amplifier circuits configured to amplify an audio signal that can be presented by the speaker 274. In an exemplary embodiment, the speaker amplifier circuit 272 may comprise a pulse width amplifier (PWM) system and a boost circuit configured to provide the speaker 274 with a signal capable of ensuring adequate audio volume output from the speaker 274. Those of skill in the art, however, will recognize that aspects described herein may be implemented in architectures which differ from the architecture illustrated in FIG. 2.

Figure 3:
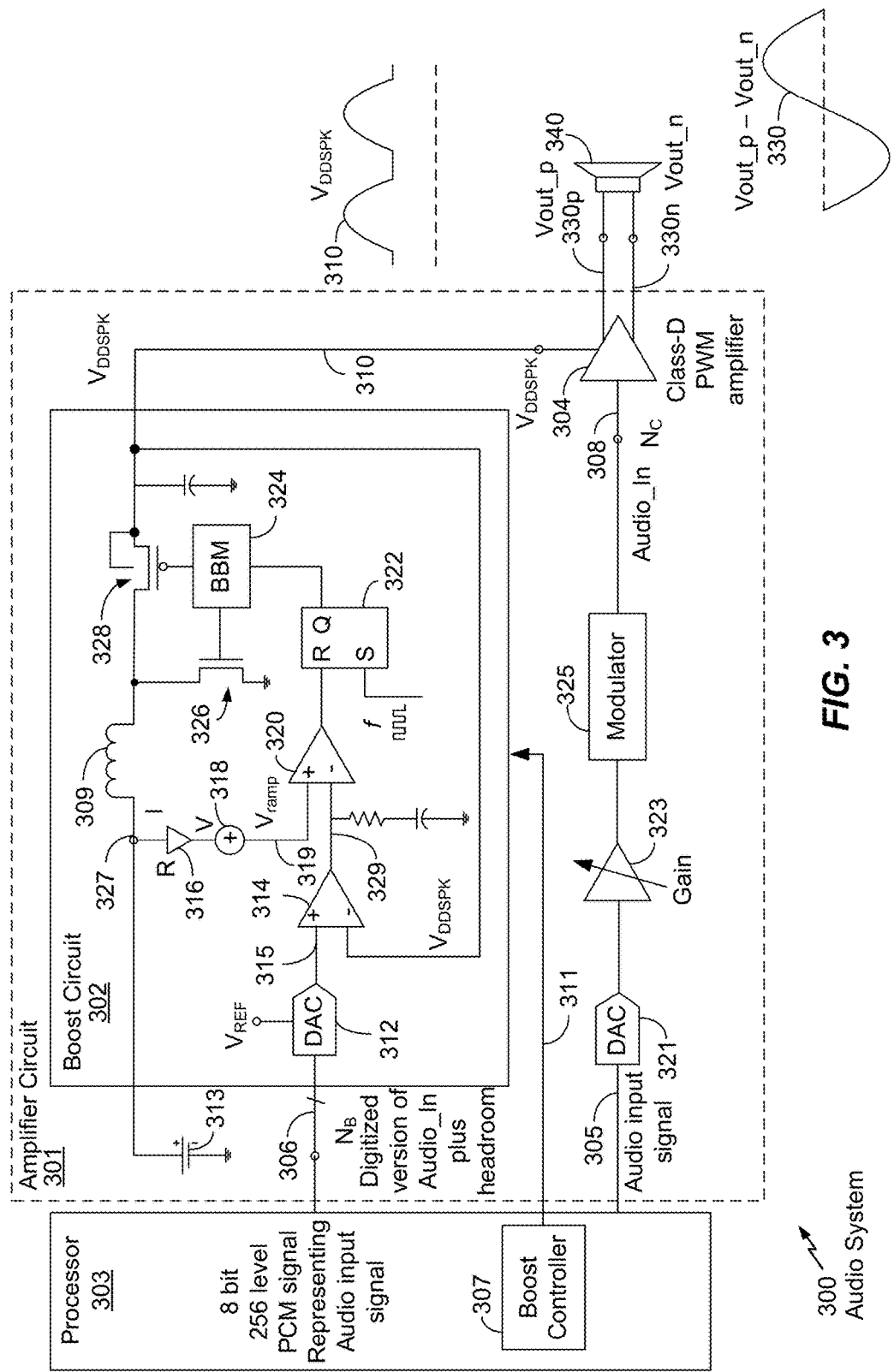
FIG. 3 is a schematic diagram illustrating an exemplary embodiment of an audio system including an exemplary embodiment of a switching amplifier having a class-H control.

FIG. 3 is a schematic diagram illustrating an exemplary embodiment of an audio system 300 including an exemplary embodiment of a switching amplifier having a class-H control. In an exemplary embodiment, the audio system 300 comprises an amplifier circuit 301 and a processor 303. The processor 303 may be an exemplary embodiment of the data processor 210 of FIG. 2. The amplifier circuit 301 may be an exemplary embodiment of the speaker amplifier circuit 272 of FIG. 2.

In an exemplary embodiment, the amplifier circuit 301 comprises a power supply 313, a boost circuit 302, a DAC 321, a gain stage 323, a modulator 325, and a class-D amplifier 304. In an exemplary embodiment, the power supply 313 may be a fixed voltage direct-current (DC) power supply, such as, for example only, a battery or other portable power source.

In an exemplary embodiment, the processor 303 outputs a digital audio input signal to the DAC 321, which converts the digital audio input signal into an analog differential audio input signal for input to the gain stage 323. The differential audio input signal may comprise two complementary signals. The gain stage 323 amplifies the differential audio input signal, and may comprise one or more amplifier stages. For example, the gain stage 323 may comprise one or more integrating amplifier stages (integrator stages). Although not shown in FIG. 3, it is to be understood that the outputs of the class-D amplifier 304 may be fed back to the gain stage 323 via a feedback network having, for example, one or more components such as, resistors, capacitors, etc., to adjust the gain and/or bandwidth of the gain stage 323.

The gain stage 323 outputs the amplified differential audio input signal to the modulator 325. The modulator 325 may be a pulse width modulator (PWM). The modulator 325 converts each one of the two signals making up the differential audio input signal into a pulse signal (for example, denoted as $G_p$ and $G_n$) comprising a series of pulses, in which the widths of the pulses are modulated by the amplitude of the signal. Although the modulator 325 and the gain stage 323 are shown separately in FIG. 3 for ease of illustration, it is to be understood that the modulator 325 and the gain stage 323 may share components. The modulator 325 modulates the analog audio input signal and provides the modulated audio input signal to the Class-D amplifier 304 over connection 308. The class-D amplifier 304 may be a pulse width modulation (PWM) amplifier, or another amplifier.

The output 330 of the class-D amplifier 304 is shown as a single ended waveform, but generally comprises a differential signal having a first signal component 330p and a second signal component 330n. The signal component 330p may be referred to as Vout_p, and the signal component 330n may be referred to as Vout_n, with the output 330 being Vout_p−Vout_n. The signal component 330p and the signal component 330n may be provided to a speaker 340. The speaker 340 may be an exemplary embodiment of the speaker 272 of FIG. 2.

The processor 303 also provides a digitized version of the audio input signal plus voltage headroom information to the boost circuit 302 over connection 306. In other words, the input signal on connection 306 is a reference signal representing the expected output of the boost circuit 302 based on the audio input signal on connection 305 plus a voltage headroom value. In an exemplary embodiment, the voltage headroom information contained in the input signal on connection 306 may include a fixed portion and an input signal dependent portion. The input signal on connection 306 may also be referred to as a boost reference signal, or as a voltage boost circuit input signal. The input signal on connection 306 may be, for example, a multiple-bit representation of the audio input signal plus the voltage headroom, which may be characterized, for example, as a voltage offset, with the input signal on connection 306 being, for example, an 8-bit signal having, for example, 256 values.

In an exemplary embodiment, the boost circuit 302 comprises a digital to analog converter (DAC) 312, a transconductance (gm) stage 314 configured as an error amplifier, a current to voltage converter 316, a ramp function 318, a comparator 320, an RS flip-flop 322, a break before make (BBM) circuit 324, an inductor 309, and switches 326 and 328.

The DAC 312 converts the input signal on connection 306 to an analog signal. The gm stage 314 amplifies the output of the DAC 312. In an exemplary embodiment, the gm stage 314 amplifies the difference between the signal on connection 315 and the signal on connection 310, and provides the difference as an error signal over connection 329 to the inverting input of the comparator 320.

The current to voltage converter 316 converts the current on connection 327 to a voltage, which is provided to the ramp function 318. The ramp function 318 scales the voltage and provides its output to a non-inverting input of the comparator 320 over connection 319. The inverting input 329 of the comparator 320 is connected to the output of the gm stage 314. In an exemplary embodiment, the gm stage 314 is an error amplifier, the inputs of which are driven by the output of the DAC 312 at the non-inverting input and by the supply voltage output $V_{DDSPK}$ of the boost circuit 302 on connection 310 at the inverting input. A divided and scaled version of the supply voltage at connection 327 is provided by the voltage supply 313 to the non-inverting input of the comparator 320 over connection 319.

The output of the comparator 320 is provided to the reset input of the flip-flop 322. The Q output of the flip-flop 322 is provided to the BBM circuit 324. The set input of the flip-flop 322 receives the switching frequency, f, of the boost circuit 302. In an exemplary embodiment, the switching frequency, f, of the boost circuit 302 may be the same or may be different than the switching frequency of the class-D amplifier 304. In an exemplary embodiment, the switching frequency, f, of the boost circuit may be, on the order of 2 MHz and the switching frequency of the class-D amplifier 304 may be on the order of 300 kHz The BBM circuit 324 ensures that both of the switches 326 and 328 remain in the off state for a short period of time so that there is no connection from output to ground during switching.

In an exemplary embodiment, the signal processing delay through the boost circuit 302 is similar to the signal processing delay through the DAC 321, the gain stage 323, and the modulator 325.

In an exemplary embodiment, the processor 303 comprises a boost controller 307. The boost controller 307 develops one or more control signals that may be provided from the processor 303 to the boost circuit 302 over connection 311. As mentioned above, the input signal on connection 306 is a reference signal representing the expected output of the boost circuit 302 based on the audio input signal on connection 305 and a voltage headroom value. In this manner, the output of the boost circuit 302 on connection 310 is a variable supply voltage that is continuously proportional to the audio input signal on connection 305.

Figure 4:
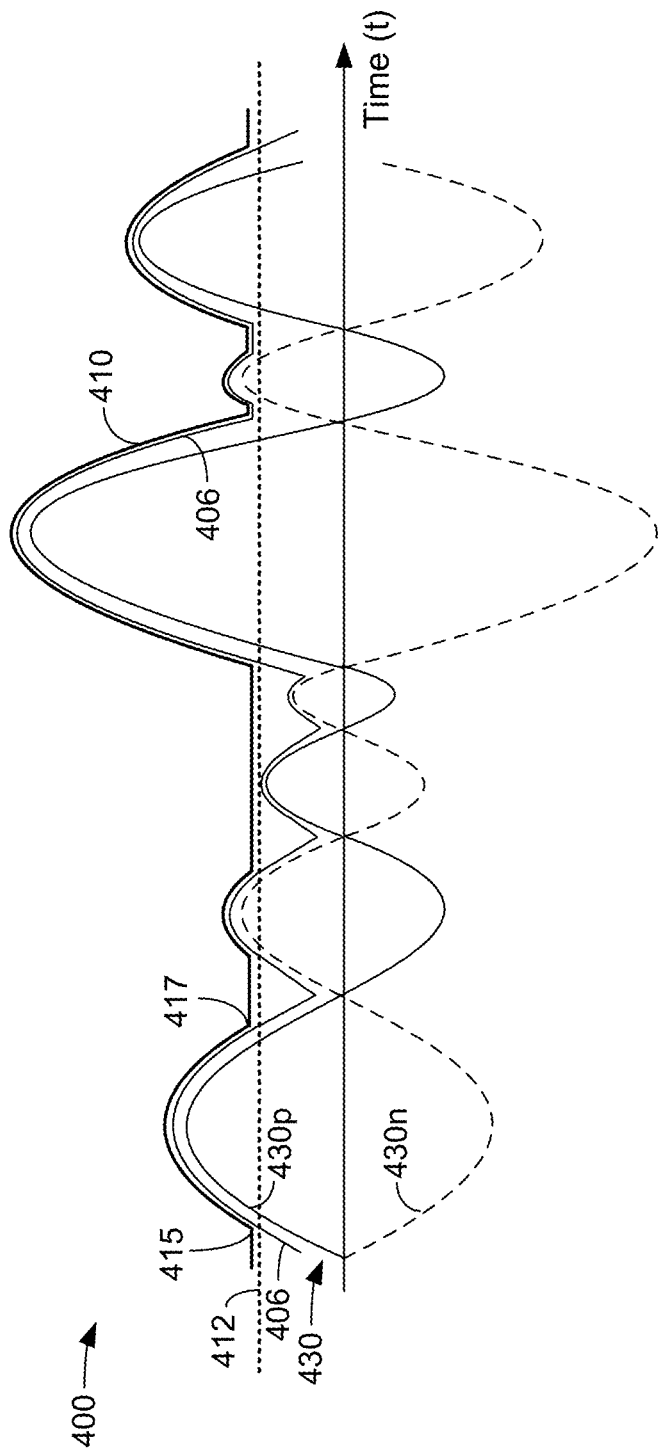
FIG. 4 is a diagram showing exemplary waveforms of the amplifier circuit of FIG. 3.

FIG. 4 is a diagram 400 showing exemplary waveforms of the amplifier circuit 301 of FIG. 3. The output signal 430 of the class-D amplifier is shown as a differential signal having a first signal component 430p and a second signal component 430n. The boost reference signal provided to the boost circuit 302 on connection 306 (FIG. 3) is shown using reference numeral 406, and the output, $V_{DDSPK}$, of the boost circuit 302 (FIG. 3) on connection 310 is shown using reference numeral 410. As shown, the output, $V_{DDSPK}$, of the boost circuit 302 (FIG. 3) on connection 310 closely tracks the audio output signal 430, particularly when the audio output signal 430 exceeds a threshold 412. In an exemplary embodiment, the threshold at which the boost circuit 302 (FIG. 3) transitions from bypass mode to boost mode is the fixed voltage provided by the power supply 313, which is shown in FIG. 4 using reference numeral 412. The voltage level represented using reference numeral 412 is dependent on application and may be selected based on one or more operating parameters. An example of a reference voltage may be four or five volts; however, other voltage levels are possible.

In an exemplary embodiment, the threshold level 412 is the voltage level at which the output of the boost circuit 302 transitions between bypass mode and boost mode, and can be at least partially dependent on the boost circuit 302. The term "bypass mode" refers to a condition when the boost circuit 302 does not provide any voltage in addition to the fixed voltage provided by the power supply 313 (FIG. 3), where the voltage on connection 310 (FIG. 3) is substantially equal to the voltage of the power supply 313, in which case the boost circuit 302 is bypassed. The term "boost mode" refers to a condition when the boost circuit 302 does provide a boost voltage in addition to the fixed voltage provided by the power supply 313 (FIG. 3), where the voltage on connection 310 is greater than the voltage of the power supply 313, in which case the boost circuit 302 is providing a boost voltage in addition to the fixed voltage provided by the power supply 313. In an exemplary embodiment, the trace 410 should closely match the trace 412 in bypass mode and should closely match the trace 406 in boost mode. The traces 406 and 410 are shown in FIG. 4 as having a small offset to enable differentiation of the traces for illustration purposes.

In an exemplary embodiment, the transition from bypass mode to boost mode may be performed as follows. In an exemplary embodiment, the 8-bit input signal on connection 306 (FIG. 3) provided to the DAC 312 includes a digitized version of the audio input signal (i.e., the signal on connection 305) and a voltage headroom value that together comprise the expected boost output voltage. The input signal to the DAC 312 on connection 306 can be expressed as follows:

The input signal on connection 306=alpha*abs (audio input signal on connection 305)+beta, where alpha is an input signal dependent coefficient (i.e., a variable or adjustable voltage headroom) and beta is an offset term (i.e., a constant, or fixed, voltage headroom). The term "abs" refers to the absolute value of the audio input signal on connection 305.

As mentioned above with regard to FIG. 3, the input signal to the DAC 312 on connection 306 represents the expected boost output voltage of the boost circuit 302. The output of the DAC 312 on connection 315 is compared against a divided and scaled version of the supply voltage provided by the power supply 313 on connection 319 to the comparator 320 to determine whether the voltage provided by the power supply 313 is greater than the expected boost output voltage of the boost circuit 302. If the supply voltage provided by the power supply 313 is less than the expected boost output voltage of the boost circuit 302 on connection 306, the boost circuit 302 transitions from bypass mode to boost mode, shown for example at point 415 of the trace 410 in FIG. 4.

Conversely, if the supply voltage provided by the power supply 313 is greater than the expected boost output voltage of the boost circuit 302 on connection 306, the boost circuit 302 transitions from boost mode to bypass mode, shown for example at point 417 of the trace 410 in FIG. 4.

FIGS. 5A, 5B, 5C, 5D, 5E, 5F, 5G, and 5H comprise a diagram 500 showing a series of waveforms depicting an exemplary manner of how the boost circuit 302 (FIG. 3) tracks the audio output signal. The audio output signal 530 is shown as a differential signal having a first signal component 530p and a second signal component 530n and the output of the boost circuit 302 is shown using reference numeral 510.

Figure 5:
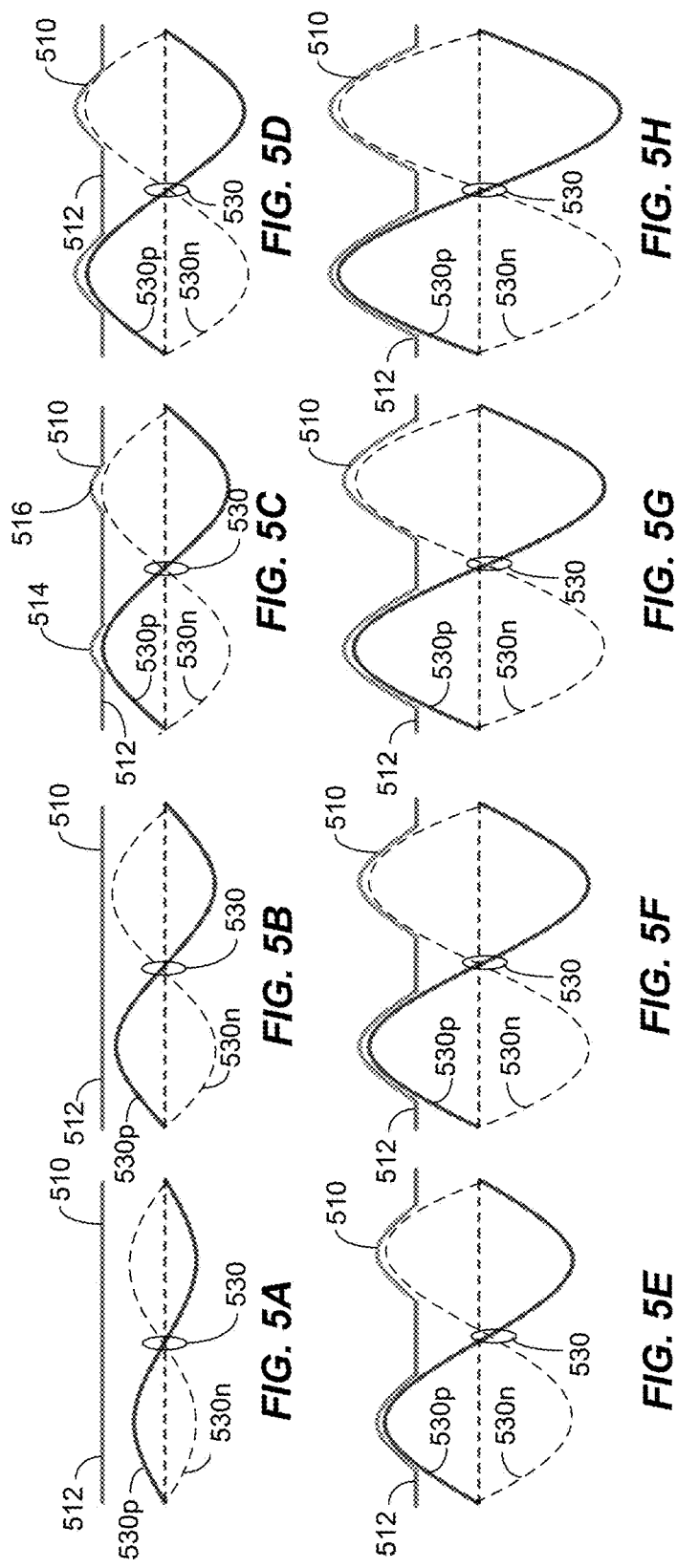
FIGS. 5A, 5B, 5C, 5D, 5E, 5F, 5G, and 5H comprise a diagram showing a series of waveforms depicting an exemplary manner of how the boost circuit tracks the audio output signal.

In FIGS. 5A and 5B, the audio output signal 530 remains below a threshold voltage, shown using reference numeral 512, such that when the audio output signal 530 remains below the threshold voltage 512, the boost circuit 302 remains in bypass mode so that the output of the boost circuit 302 on connection 310 remains at the voltage level of the power supply 313.

As shown in FIG. 5C, as the level of the audio output signal 530 exceeds the threshold 512, the output 510 of the boost circuit 302 enters boost mode (shown illustratively using reference numerals 514 and 516), thus providing voltage in addition to the threshold voltage 512 during the time when the audio output signal 530 exceeds the threshold 512.

As shown in FIGS. 5D, 5E, 5F, 5G and 5H, as the level of the audio output signal 530 exceeds the threshold 512 by greater and greater voltage, the output 510 of the boost circuit 302 enters boost mode for a longer and longer time, thus providing voltage in addition to the threshold voltage 512 during the time when the audio output signal 530 exceeds the threshold 512.

For example, as the magnitude of the audio output signal 530 increases and exceeds the threshold level, where the boost circuit is in bypass mode (generally, under 5V for a lithium-ion battery), and transitions to boost mode, the boost circuit will be active and provide additional supply voltage to the class-D amplifier 304. As shown by FIGS. 5A, 5B, 5C, when the audio output signal 530 is at relatively low levels, the boost circuit 302 remains predominantly in bypass mode, so that the combined efficiency of the boost circuit 302 and the class-D amplifier 304 is predominantly driven by the class-D amplifier 304, thus increasing overall efficiency of the amplifier circuit 301.

Further, because the output 310 of the boost circuit 302 closely tracks both components 530p and 530n of the audio output signal 530, the boost circuit 302 provides boost only for the time that the audio output signal 530 exceeds the threshold 512. In an exemplary embodiment, when the voltage boost circuit 302 enters boost mode, the voltage boost circuit 302 and the class-D amplifier 304 operate as a class-H amplifier circuit, or a class-D amplifier with class-H control.

Figure 6:
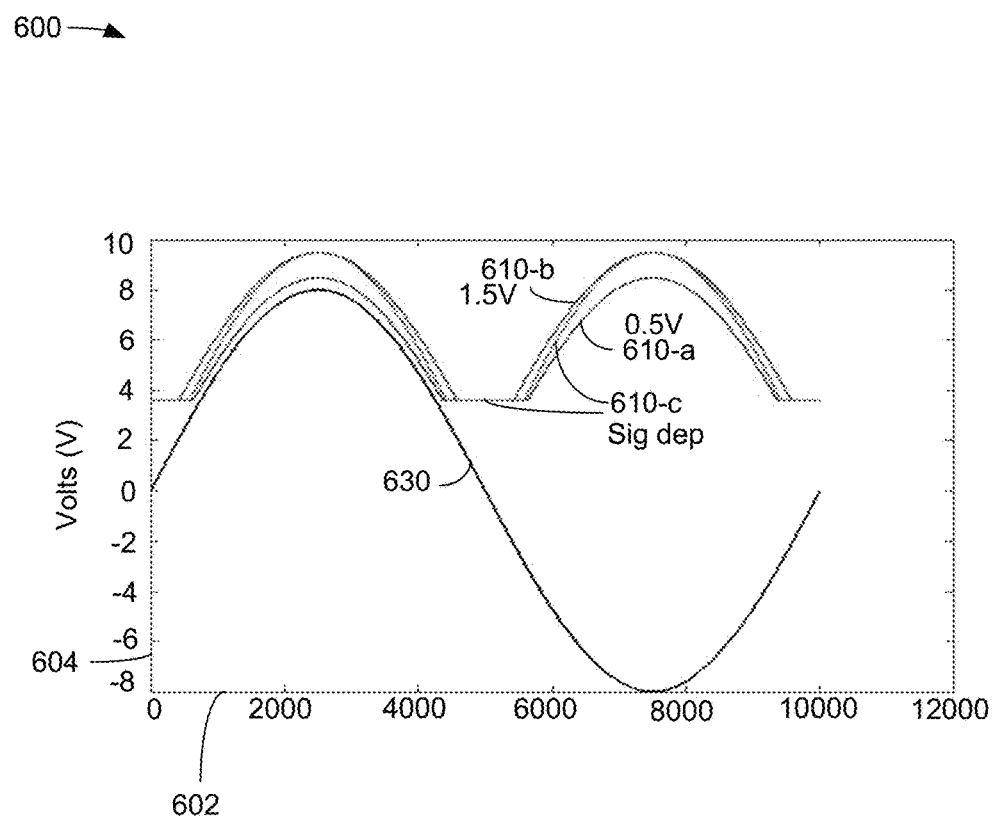
FIG. 6 is a diagram illustrating the input signal dependent headroom.

FIG. 6 is a diagram 600 illustrating audio input signal dependent headroom. The horizontal axis 602 shows a random numbering scheme that can be converted to a time scale, based on the frequency of the class-D output signal represented by the trace 630. For example, the frequency of the signal represented by the trace 630 may range from approximately 20 Hz, in which case the trace 630 may occupy 50 milliseconds (ms), to 1 kHz, in which case the trace 630 may occupy 1 ms. The vertical axis 604 shows voltage in volts (V). The signal 630 represents the output of the class-D amplifier 304 and is shown in single-ended form, but will include differential components, as described herein. The trace 610-a shows the output of the boost circuit 302 with a headroom of 0.5V, the trace 610-b shows the output of the boost circuit 302 with a headroom of 1.5V and the trace 610-c shows the output of the boost circuit 302 with a signal dependent headroom, that may vary based on the level of the audio input signal. In an exemplary embodiment, the signal dependent trace 610-c may comprise a fixed headroom portion and a signal dependent portion that may be variable, or adjustable. In an exemplary embodiment, the signal dependent trace 610-c meets the 1.5V trace 610-b at the peak. The voltage headroom value between the output of the voltage boost circuit and the output of the class-D amplifier is proportional to a magnitude of the audio input signal in that a smaller magnitude audio input signal will result in a smaller headroom, while a larger magnitude audio input signal will result in a larger magnitude headroom.

As mentioned above, the input signal on connection 306 represents the desired output of the boost circuit 302 (FIG. 3) for the audio input signal on connection 305 (FIG. 3). In an exemplary embodiment, the boost circuit 302 will be in bypass mode when alpha*speaker_out+beta<the voltage of the power supply 313, where the speaker output, speaker_out, is 330p–330n (FIG. 3).

In an exemplary embodiment, the boost circuit 302 will be in boost mode when alpha*speaker_out+beta>the voltage of the power supply 313, where the speaker output, speaker_out, is 330p–330n (FIG. 3).

With regard to the voltage headroom, the total voltage headroom=(alpha-1)*speaker_out+beta, where "alpha-1" indicates the signal dependent portion of the headroom and "beta" indicates the constant portion of the headroom. In an exemplary embodiment, the value of "alpha" and "beta" can be variable and can be adjustable, or selectable, based on programmable settings.

Figure 7:
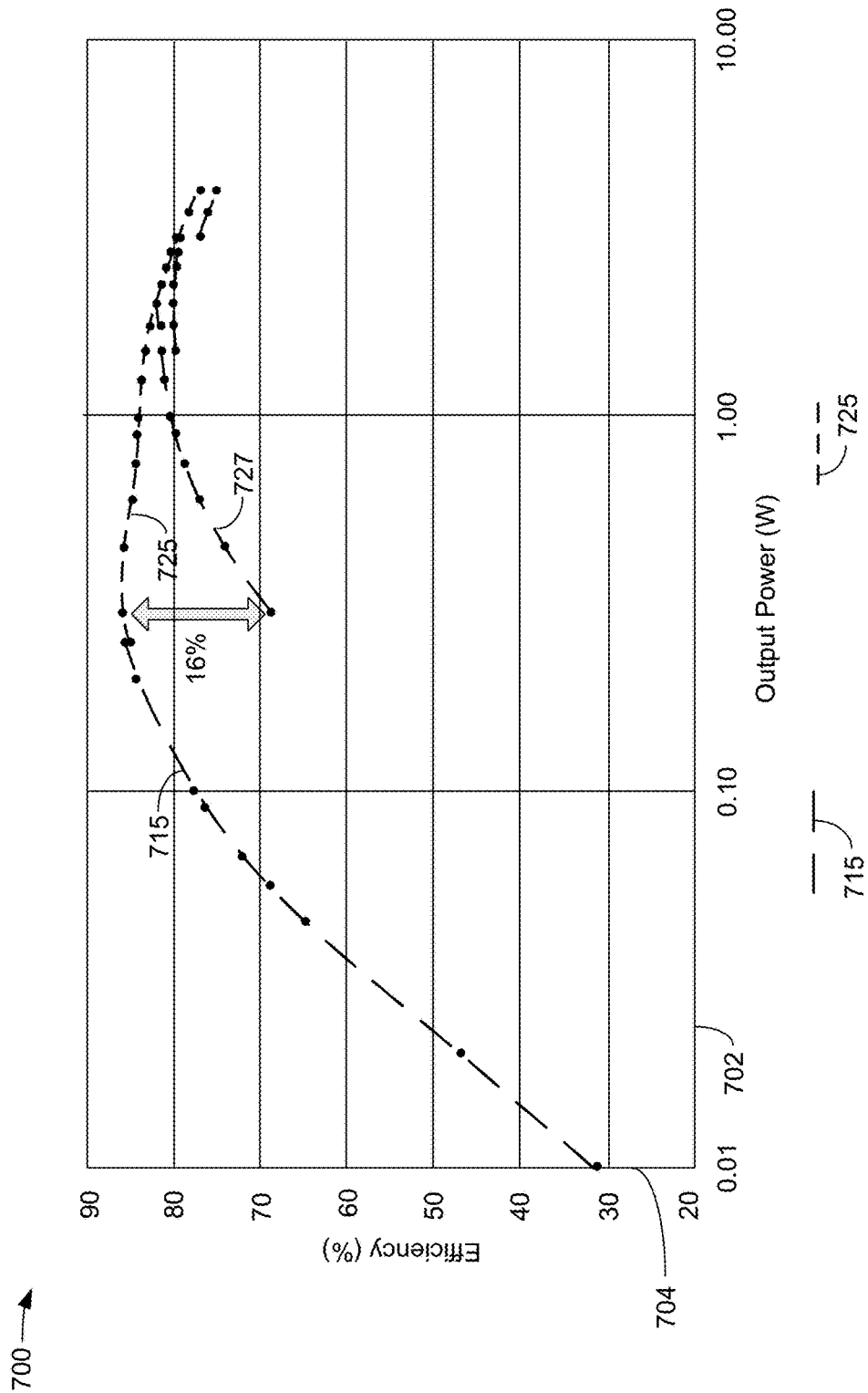
FIG. 7 is a diagram illustrating exemplary efficiency of the audio system of FIG. 3.

FIG. 7 is a diagram 700 illustrating exemplary efficiency of the audio system 300. The horizontal axis 702 shows output power in watts (W) delivered to the speaker 340 (FIG. 3) and the vertical axis 704 shows efficiency in (%). The trace 715 includes a portion 725 that shows a relatively high efficiency of about higher than 80% at an output power range of approximately 0.4 watts (W) to approximately 3 W. The trace portion 727 illustrates a prior implementation in which a boost circuit provides an exemplary 6V output. At the point at which the 6V output is initiated, there is a significant drop in overall efficiency. As shown in FIG. 7, the portion 725 of the trace 715 that shows that when the boost circuit 302 is initiated, that there is an approximate 16% improvement in efficiency, compared to the trace 727.

FIGS. 8A and 8B are diagrams illustrating the programmable decay aspect of the boost circuit 302 (FIG. 3). FIG. 8A shows a graph 800 in which the axis 802 represents time (t). The graph 800 shows an audio output signal (in single-ended form) 830, a boost reference signal 806 representing the desired output of the boost circuit 302 (FIG. 3) and the boost output 810, $V_{DDSPK}$, of the boost circuit 302. In the embodiment shown in FIG. 8A, the decay of the boost output 810 is referred to as "slow" in that it does not closely track the audio output signal 830.

The graph 850 shows an audio output signal (in single-ended form) 880 in which axis 852 represents time (t), a boost reference signal 856 representing the desired output of the boost circuit 302 (FIG. 3) and the boost output 860, $V_{DDSPK}$, of the boost circuit 302. In the embodiment shown in FIG. 8B, the decay of the boost output 860 is referred to as "fast" in that it tracks the audio output signal 880 closer than the decay of the boost output 810 tracks the audio output signal 830. The terms "slow" and "slow decay" and the terms "fast" and "fast decay" are relative to each other.

Figure 9:
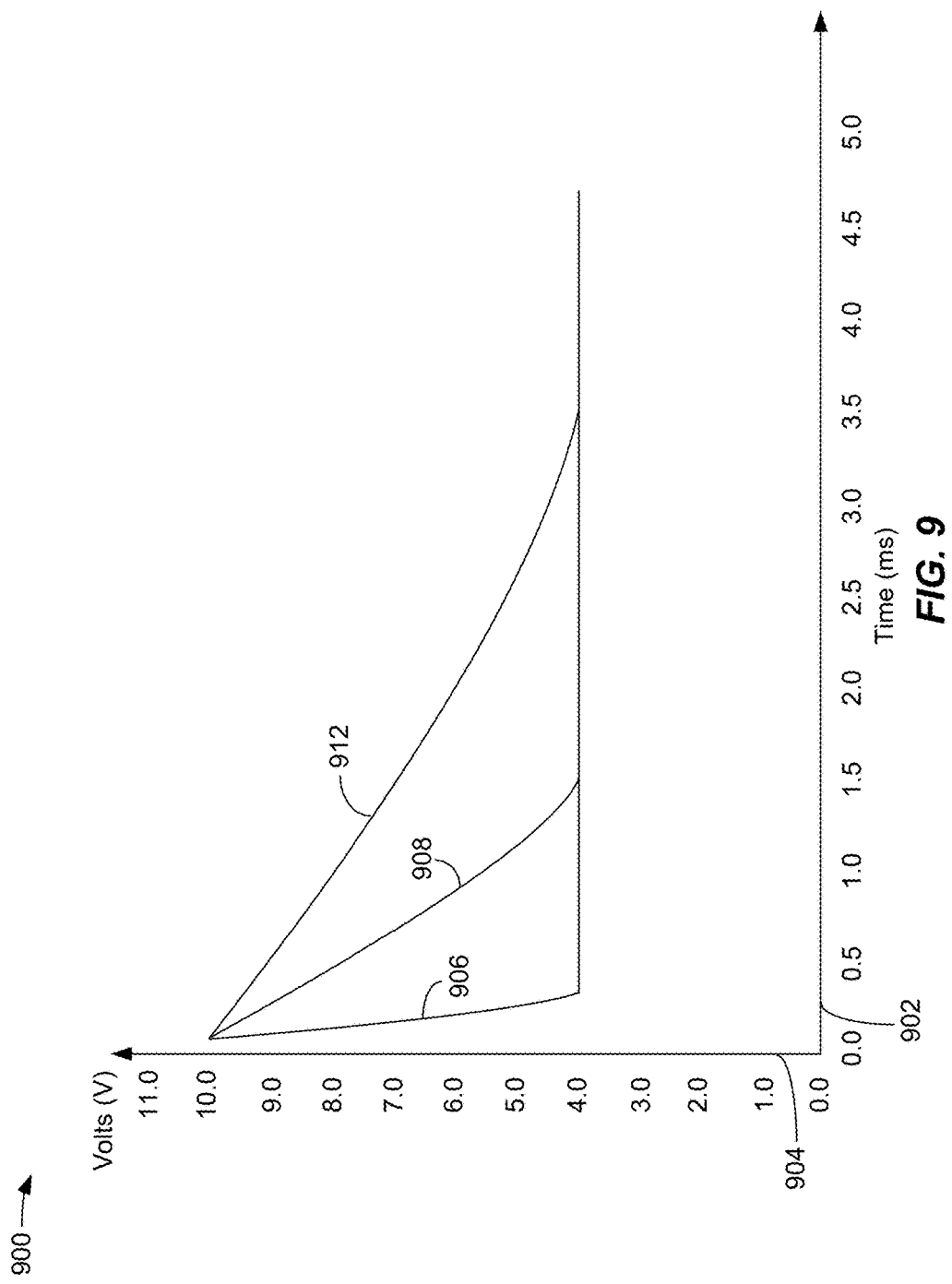
FIG. 9 is a diagram showing a graph showing exemplary impulse response curves of the control signal provided by the processor to the boost circuit that controls the boost output signal.

FIG. 9 is a diagram showing a graph 900 showing exemplary impulse response curves of the control signal provided by the processor 303 to the boost circuit 302, that controls the boost output signal.

The horizontal axis 902 represents time (in ms) and the vertical axis 904 represents voltage (V). The boost controller 307 can provide a programmable decay time to apply to the boost circuit 302, to control the degree to which the boost output 310 tracks, or follows the audio output signal 330. In an exemplary embodiment, the control signal provided by the boost controller 307 may be developed using a single multiplier, i.e., a single decay value, or parameter, where $y(n)=x(n)*(1-\text{lambda}(\lambda))$ on the decay side of the boost output 310, where lambda is a variable decay value, or parameter.

The control signal on connection 311 generates an exponential decay of the boost output 310, which decreases at a rate proportional to its current value. The boost controller 307 analyzes samples of the output signal 310 at a pre-defined rate. If at any time a sample is larger than the previous sample, the system is reset and the boost output 310 immediately goes to the new higher value, and the system starts over. The boost output 310 will only continue to decay if all the new samples are lower than the decaying level. To adjust, or program, the decay time, a programmable counter (FIG. 10) can effectively multiply the decay time (TC), by a counter value.

An example of a table corresponding to the programmable decay is shown as Table 1.

TABLE 1

| decay (realease) count | real time (ms) | |
|---|---|---|
| 0 | 0.3 | Fast track mode |
| 3 | 0.9 | |
| 9 | 2.7 | |
| 30 | 9 | |
| 100 | 30 | |
| 300 | 90 | |
| 1000 | 300 | |
| 3000 | 900 | |

The effect of Table 1 is illustrated in FIG. 9 as a decay to an impulse, also referred to as an impulse response. The trace 906 corresponds to a decay count of "0", the trace 908 corresponds to a decay count of "3" and the trace 912 corresponds to a decay count of "9."

In an exemplary embodiment, the trace 906 shows an impulse response that corresponds to a decay time that is faster than the decay time illustrated by the trace 908. Similarly, the trace 908 corresponds to a decay time that is faster than the decay time illustrated by the trace 912.

In the exemplary embodiment shown in FIG. 9, the traces 906, 908, and 912 decay to an exemplary voltage of 4V, which corresponds to a battery voltage in this example. Other voltages are possible.

Figure 10:
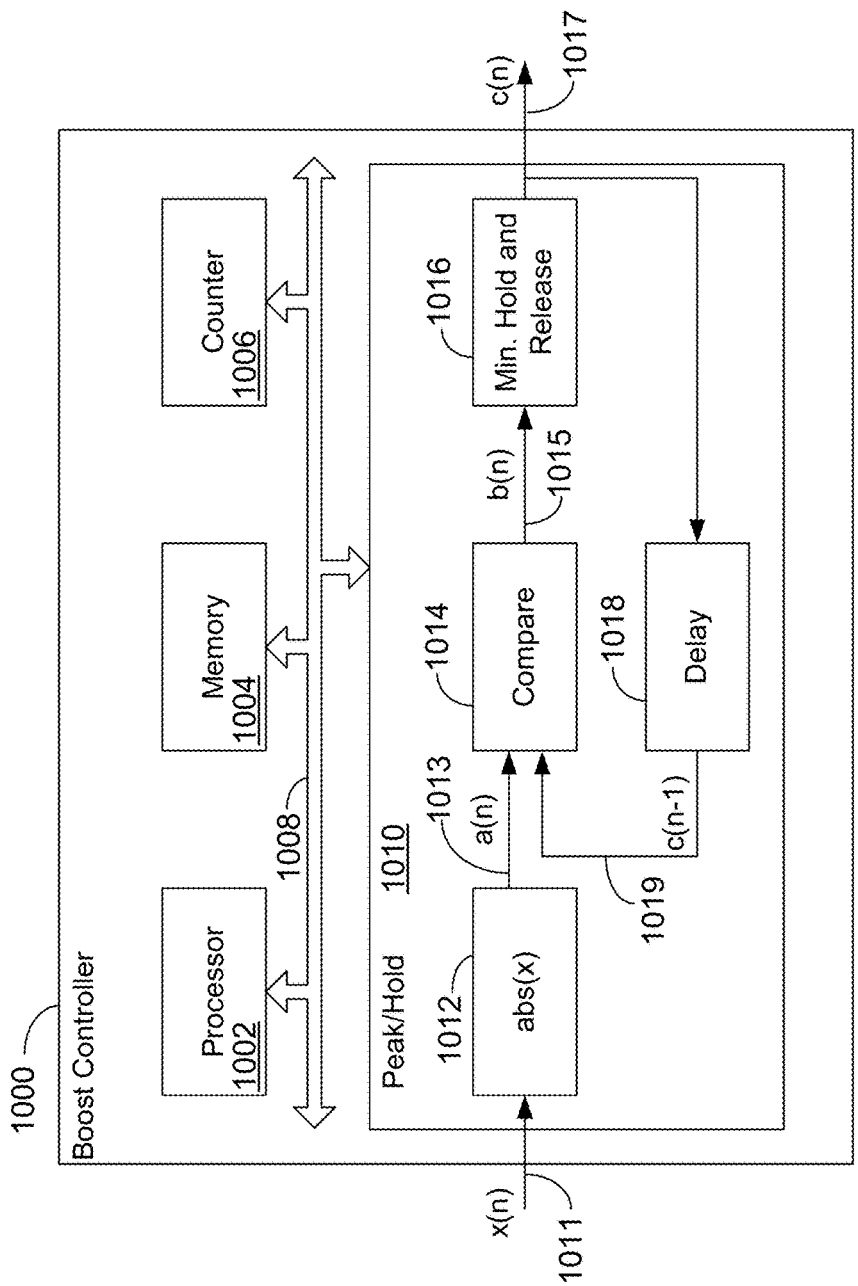
FIG. 10 is a block diagram showing an exemplary embodiment of the boost controller of FIG. 3.

FIG. 10 is a block diagram showing an exemplary embodiment of the boost controller 307 of FIG. 3. In an exemplary embodiment, the boost controller 1000 may be an exemplary embodiment of the boost controller 307 of FIG. 3. In an exemplary embodiment, the boost controller 1000 comprises a processor 1002, a memory 1004, a programmable counter 1006 and a peak/hold circuit 1010, all of which are in operable communication over a system bus 1008. In an exemplary embodiment, the boost controller 1000 may be a separate element, or may form a part of, and may use common elements of the processor 303 of FIG. 3.

In an exemplary embodiment, the peak/hold circuit 1010 may comprise an absolute (abs(x)) function 1012 representing the absolute value of the audio input signal on connection 305, a compare function 1014, a minimum hold and release function 1016 and a delay function 1018.

In an exemplary embodiment, the audio input signal on connection 305 (FIG. 3) is clocked into the boost controller 1000 as the signal x(n) at approximately 384 kHz. The absolute value, a(n), of the audio input signal on connection 1011 is provided over connection 1013 to the compare function 1014. The compare function 1014 continually compares the absolute value of the current sample (a(n)) on connection 1013 to a held value of the previously largest peak or a decaying version of a previous peak, c(n−1) on connection 1019. The compare function 1014 effectively tracks the maximum peaks of the audio input signal as they go higher. If the audio input signal, a(n) is greater than the previously held value (c(n−1), the output signal, b(n) on connection 1015 will immediately transition to the higher sample value. As the audio input signal goes lower on successive samples, after a minimum hold time (e.g., 10 cycles at 384 kHz), the 'c(n)' output on connection 1017 starts to decay exponentially with a release rate. It will not release unless the input, a(n), is below the previously held sample, c(n−1). If a higher peak arrives during the decay period, the peak/hold circuit 1010 will track back up immediately with the new higher signal and the process begins again. The output signal on connection 1017 is an exemplary embodiment of the signal on connection 311 (FIG. 3).

The release has an exponential decay. If (a(n)<c(n−1), then c(n)=c(n−1)*(1−lambda), upon release, where lambda (λ) is a decay parameter. Because the new value is proportional to the currently held value, the response is an exponential decay. In an exemplary embodiment, for an exemplary 384 kHz clock rate, the value of lambda (λ) is selected such that the release time will result in a TC (time constant)=~300 us. In this example, this is the time used to decay to 36.8% (1 TC) of its initial value. Using the programmable counter 1006, the decay time may be amplified (i.e., lengthened) while still using a fixed value for lambda (λ). In an exemplary embodiment, the decay multiplier, lambda, has a single value, but the time is amplified (i.e., lengthened) using the programmable counter 1006. In this manner, a single decay multiplier can be used, while still allowing for different decay responses based on the value of the programmable counter 1006. In this manner, it is possible to have the instantaneous attack and decay profile for envelope tracking of the class-D output signal, and also have the programmable (variable) decay rates that allow variable decay profiles, as shown in Table 1. For example, the combination of the decay parameter, lambda, and the clock rate (i.e., interval at which the next adjustment in level is made) of 384 kHz define the first (fastest) decay with no additional counter input. This is shown in Table 1 as a decay (release) count of 0. Then, if the programmable counter 1006 is implemented, the time before the next decay multiplication is made can be prolonged (stretched) to decrease the value, and lengthen the decay time. Therefore, the higher the count, the longer the decay time can be prolonged (stretched). As mentioned above, if a new higher value appears on connection 1013, on any 384 kHz clock cycle, the output on connection 1017 increases to that value immediately.

In an exemplary embodiment, the programmable counter 1006 inserts an additional time interval based on the release calculations. For example, keeping lambda (λ) fixed at ⅟₁₂₈ (0.0078125), the exemplary following selectable (8 settings) decay times from 300 us to 900 ms are possible, as shown above in Table 1. This may be called the "decay (release) count". The "count" settings are with respect to running the peak and hold circuit 1010 at 384 KHz in this example. In an exemplary embodiment, the value of lambda remains the same for each different decay response, but the time is amplified with the counter 1006, as described above.

Figure 11:
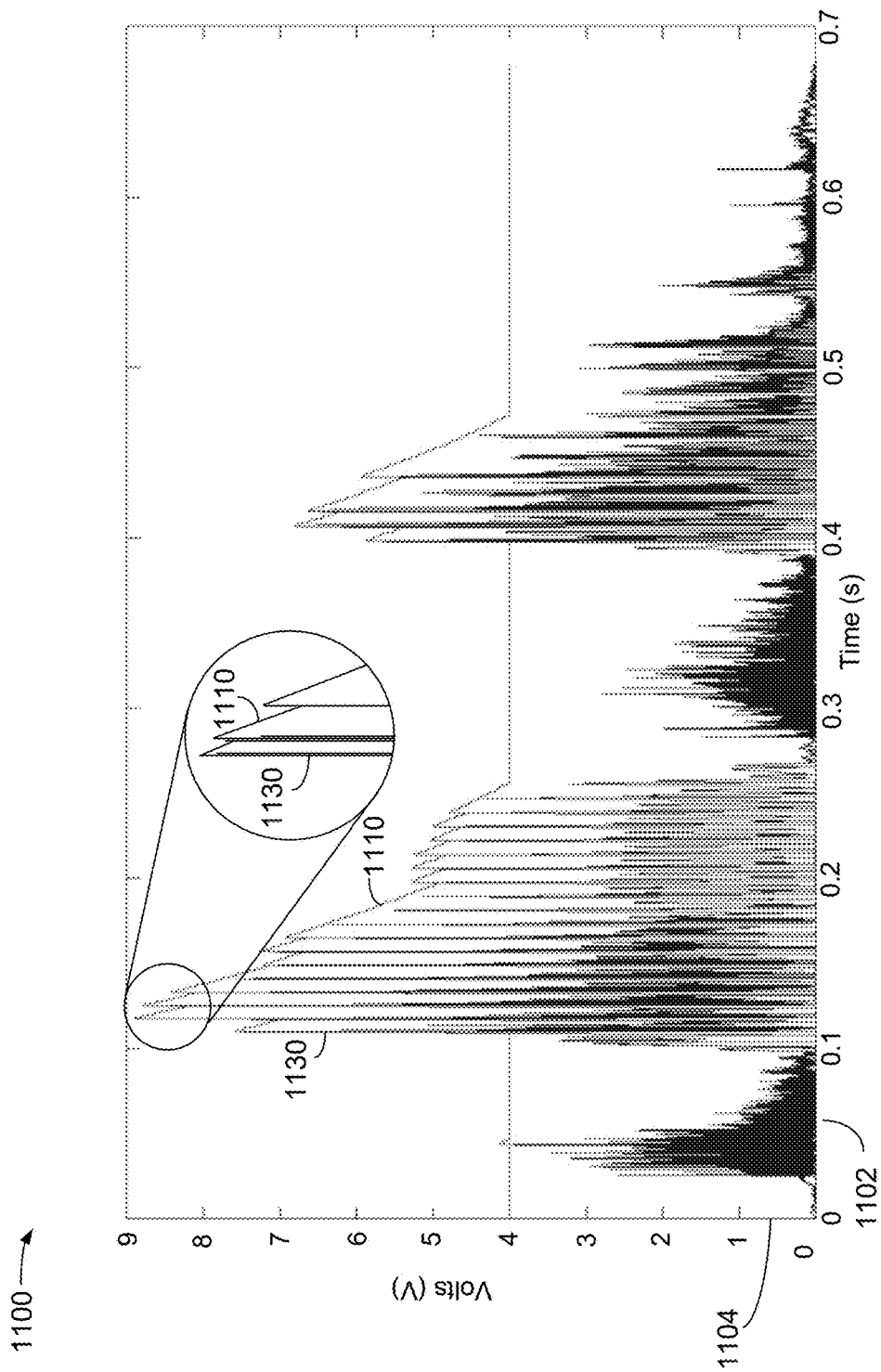
FIG. 11 is a diagram showing a graph showing an exemplary "slow" decay rate of the boost output signal.

FIG. 11 is a diagram showing a graph 1100 showing an exemplary "slow" decay rate of the boost output signal. The horizontal axis 1102 represents time (in seconds) and the vertical axis 1104 represents voltage (V). The trace 1130 corresponds to the audio output signal (i.e., 330 in FIG. 3), and the trace 1110 represents the boost output voltage, $V_{DDSPK}$, of the boost circuit 302 (FIG. 3). As shown in the inset, the boost output 1110 follows the audio output signal 1130, and in FIG. 11, is shown as having a "slow" decay rate as illustrated by the slope of the boost output signal 1110. The decay rate in FIG. 11 corresponds to a decay (release) count of approximately 300 shown in Table 1.

Figure 12:
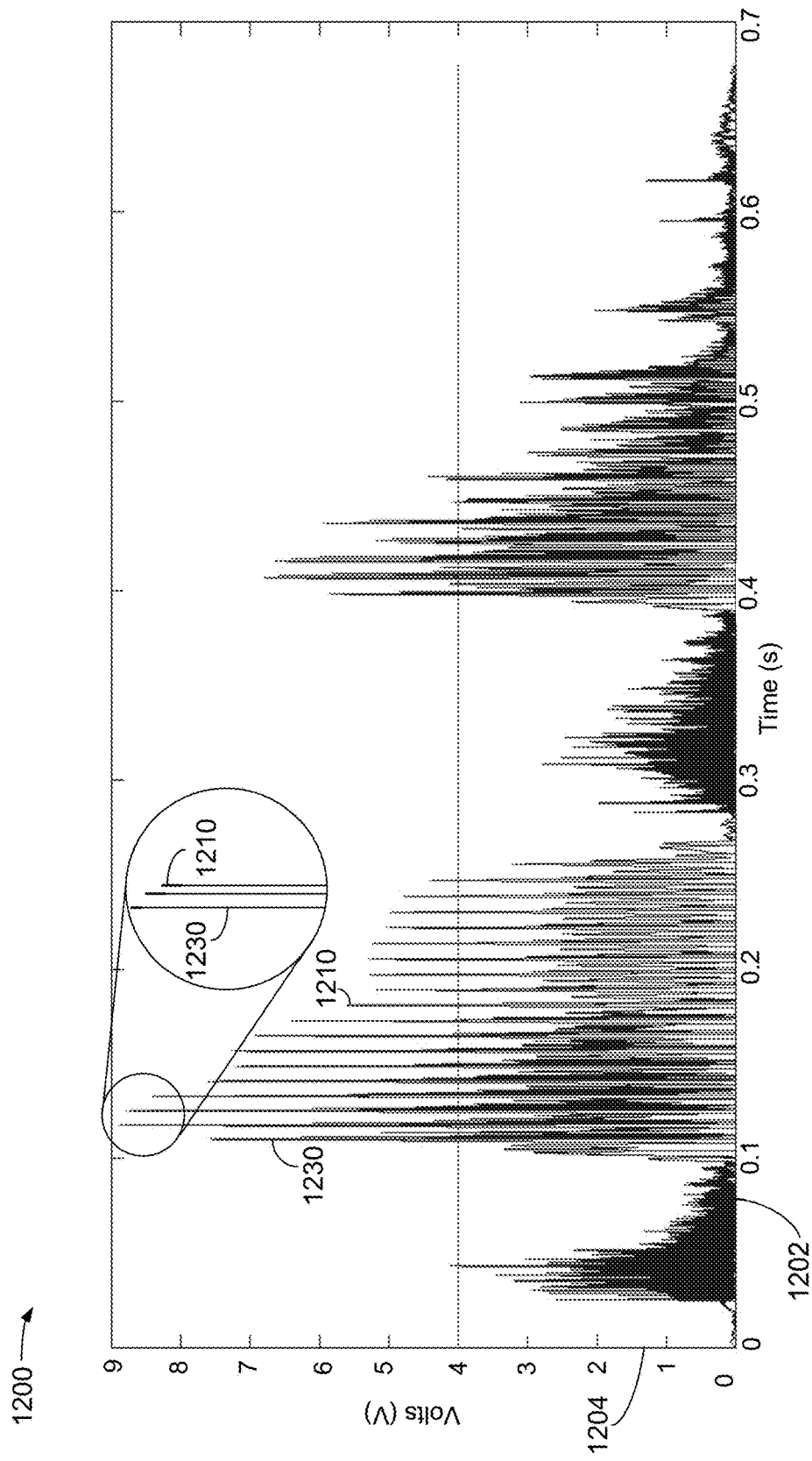
FIG. 12 is a diagram showing a graph showing an exemplary "fast" decay rate of the boost output signal.

FIG. 12 is a diagram showing a graph 1200 showing an exemplary "fast" decay rate of the boost output signal. The horizontal axis 1202 represents time (in seconds) and the vertical axis 1204 represents voltage (V). The trace 1230 corresponds to the audio output signal (i.e., 330 in FIG. 3), and the trace 1210 represents the boost output voltage, $V_{DDSPK}$, of the boost circuit 302 (FIG. 3). As shown in the inset, the boost output 1210 follows the audio output signal 1230, and in FIG. 12, is shown as having a "fast" decay rate as illustrated by the lack of slope of the boost output signal 1210 with respect to the audio output signal 1230. In the exemplary embodiment shown in FIG. 12, the boost output 1210 is considered to be in "fast track" mode in that its decay closely follows the audio output signal 1230. The decay rate in FIG. 12 corresponds to a decay (release) count of 0 shown in Table 1, where the decay is based only on a value of lambda with no additional response added by the counter 1006 (FIG. 10).

Figure 13:
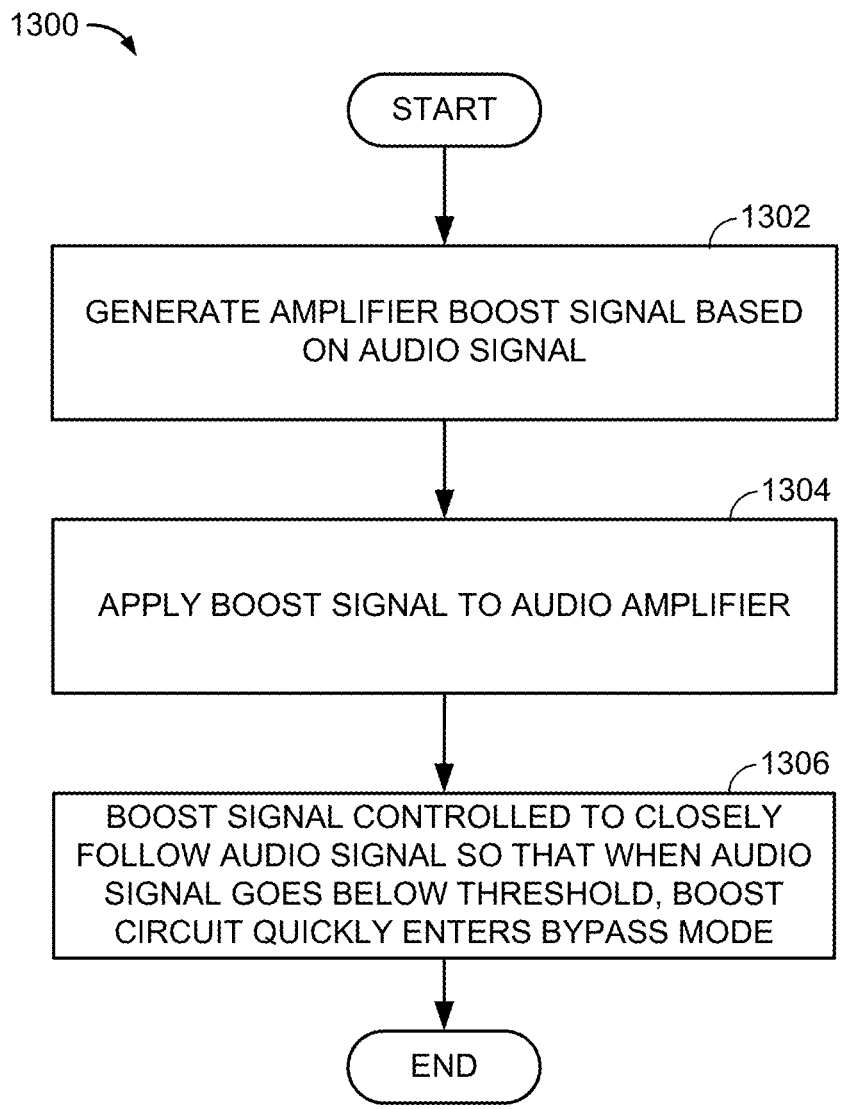
FIG. 13 is a flow chart describing the operation of an exemplary embodiment of an amplifier circuit.

FIG. 13 is a flow chart 1300 describing the operation of an exemplary embodiment of an amplifier circuit. The blocks in the method 1300 can be performed in or out of the order shown, and in some embodiments, can be performed at least in part in parallel.

In block 1302, an amplifier boost signal is generated based on an audio signal. In block 1304, the boost signal is applied to an audio amplifier. In block 1306, the boost signal is controlled to closely follow the audio signal so that when the audio signal goes below a threshold, a boost circuit quickly enters bypass mode.

Figure 14:
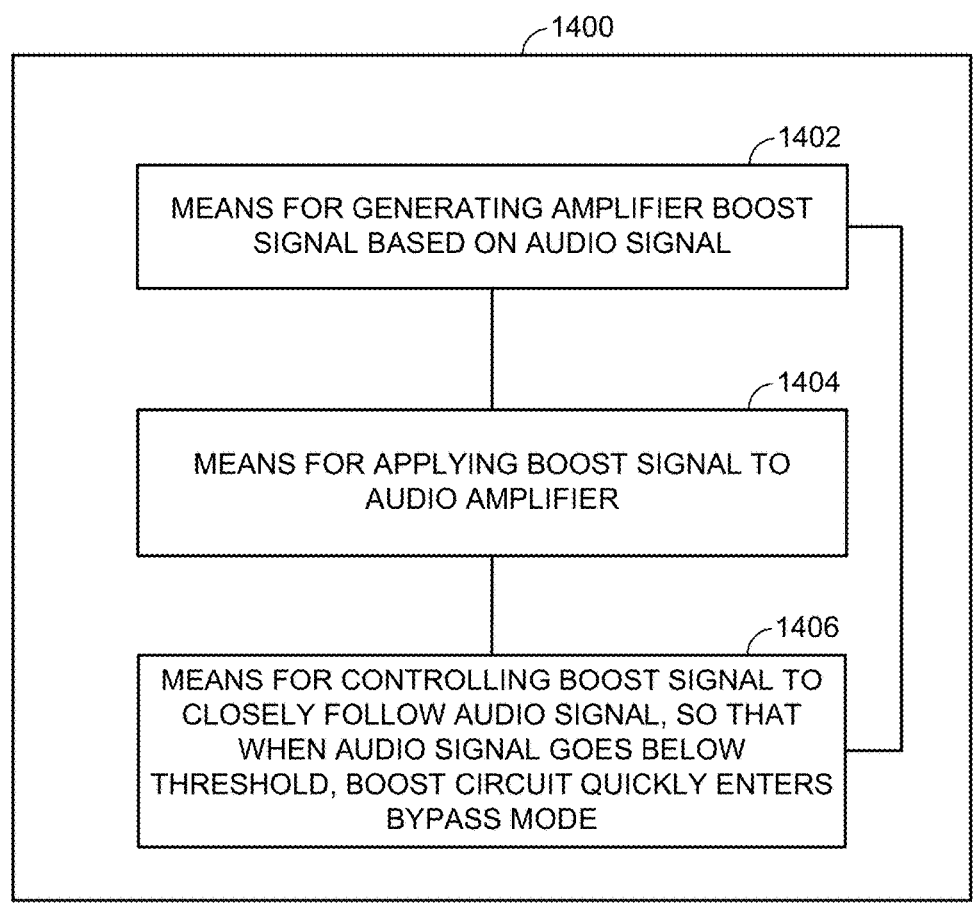
FIG. 14 is a functional block diagram of an apparatus for amplifying an audio signal.

FIG. 14 is a functional block diagram of an apparatus for amplifying an audio signal. The apparatus comprises means 1402 for generating a boost signal based on an audio signal. In certain embodiments, the means 1402 for generating a boost signal based on an audio signal can be configured to perform one or more of the function described in operation block 1302 of method 1300 (FIG. 13). In an exemplary embodiment, the means 1402 for generating a boost signal based on an audio signal may comprise the amplifier circuit 301 and various embodiments thereof.

The apparatus 1400 further comprises means 1404 for applying the boost signal to an audio amplifier. In certain embodiments, the means 1404 for applying the boost signal to an audio amplifier can be configured to perform one or more of the function described in operation block 1304 of method 1300 (FIG. 13). In an exemplary embodiment, the means 1404 for applying the boost signal to an audio amplifier may comprise the amplifier circuit 301 and various embodiments thereof.

The apparatus 1400 further comprises means 1406 for controlling the boost signal to closely follow the audio signal, so that when the audio signal goes below a threshold, the boost circuit quickly enters bypass mode. In certain embodiments, the means 1406 for controlling the boost signal to closely follow the audio signal, so that when the audio signal goes below a threshold, the boost circuit quickly enters bypass mode can be configured to perform one or more of the function described in operation block 1306 of method 1300 (FIG. 13). In an exemplary embodiment, the means 1406 for controlling the boost signal to closely follow the audio signal, so that when the audio signal goes below a threshold, the boost circuit quickly enters bypass mode may comprise the amplifier circuit 301 and various embodiments thereof.

The embodiments of the amplifier circuit described herein can be configured to provide additional voltage to an audio amplifier when a threshold is exceeded, while allowing the audio amplifier to quickly enter and remain in bypass mode when the threshold is not exceeded. This allows a class-D audio amplifier to obtain, or approach the efficiency of a class-H amplifier, while providing increased audio volume when needed.

The amplifier system and the amplifier circuit described herein may be implemented on one or more ICs, analog ICs, RFICs, mixed-signal ICs, ASICs, printed circuit boards (PCBs), electronic devices, etc. The amplifier system and the amplifier circuit may also be fabricated with various IC process technologies such as complementary metal oxide semiconductor (CMOS), N-channel MOS (NMOS), P-channel MOS (PMOS), bipolar junction transistor (BJT), bipolar-CMOS (BiCMOS), silicon germanium (SiGe), gallium arsenide (GaAs), heterojunction bipolar transistors (HBTs), high electron mobility transistors (HEMTs), silicon-on-insulator (SOI), etc.

An apparatus implementing the amplifier system and the amplifier circuit described herein may be a stand-alone device or may be part of a larger device. A device may be (i) a stand-alone IC, (ii) a set of one or more ICs that may include memory ICs for storing data and/or instructions, (iii) an RFIC such as an RF receiver (RFR) or an RF transmitter/receiver (RTR), (iv) an ASIC such as a mobile station modem (MSM), (v) a module that may be embedded within other devices, (vi) a receiver, cellular phone, wireless device, handset, or mobile unit, (vii) etc.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

As used in this description, the terms "component," "database," "module," "system," and the like are intended to refer to a computer-related entity, either hardware, firmware, a combination of hardware and software, software, or software in execution. For example, a component may be, but is not limited to being, a process running on a processor, a processor, an object, an executable, a thread of execution, a program, and/or a computer. By way of illustration, both an application running on a computing device and the computing device may be a component. One or more components may reside within a process and/or thread of execution, and a component may be localized on one computer and/or distributed between two or more computers. In addition, these components may execute from various computer readable media having various data structures stored thereon. The components may communicate by way of local and/or remote processes such as in accordance with a signal having one or more data packets (e.g., data from one component interacting with another component in a local system, distributed system, and/or across a network such as the Internet with other systems by way of the signal).

Although selected aspects have been illustrated and described in detail, it will be understood that various substitutions and alterations may be made therein without departing from the spirit and scope of the present invention, as defined by the following claims.

What is claimed is:

1. An amplifier circuit, comprising:
   an amplifier;
   a voltage boost circuit configured to provide a variable supply voltage to the amplifier, the variable supply voltage continuously proportional to an audio input signal, the variable supply voltage configured to follow an output of the amplifier with a programmable variable decay; and
   a boost controller configured to generate a control signal configured to control the variable supply voltage using the programmable variable decay.

2. The amplifier circuit of claim 1, wherein the amplifier comprises a class D amplifier; and
   wherein a voltage headroom value between an output of the voltage boost circuit and an output of the class-D amplifier is proportional to a magnitude of the audio input signal.

3. The amplifier circuit of claim 1, wherein the audio input signal is an audio input signal to the amplifier and the voltage boost circuit is configured to receive a voltage boost circuit input signal, the voltage boost circuit input signal comprising a multiple-bit representation of the audio input signal and a voltage headroom value.

4. The amplifier circuit of claim 3, wherein the multiple-bit representation of the audio input signal and the voltage headroom value comprises 8-bits.

5. The amplifier circuit of claim 3, wherein when the output of the amplifier exceeds a threshold, the voltage boost circuit provides a boost voltage to the class-D amplifier in addition to a fixed voltage.

6. The amplifier circuit of claim 1, wherein the voltage boost circuit and the amplifier have similar signal processing delay.

7. The amplifier circuit of claim 5, wherein the threshold comprises a voltage at which the voltage boost circuit transitions between a bypass mode and a boost mode.

8. The amplifier circuit of claim 7, wherein the multiple-bit representation of the audio input signal and the voltage headroom value is compared against the fixed voltage to determine whether the voltage boost circuit provides the boost voltage in addition to the fixed voltage.

9. The amplifier circuit of claim 7, wherein when the voltage boost circuit enters boost mode, the voltage boost circuit and the amplifier operate as a class-H amplifier circuit.

10. The amplifier circuit of claim 1, wherein the programmable variable decay is chosen to allow the variable supply voltage to adjustably follow the output of the amplifier.

11. The amplifier circuit of claim 10, further comprising a counter configured to further adjustably control a rate at which the variable supply voltage adjustably follows the output of the amplifier.

12. A device, comprising:
    means for amplifying an audio input signal;
    means for providing a variable supply voltage to the amplifying means, the variable supply voltage continuously proportional to an audio input signal, the variable supply voltage configured to follow an output of the amplifying means with a programmable variable decay; and
    means for generating a control signal configured to control the variable supply voltage using the programmable variable decay.

13. The device of claim 12, further comprising means for providing a variable voltage headroom value between the variable supply voltage and an output of the amplifying means, the variable voltage headroom value being proportional to a magnitude of the audio input signal.

14. The device of claim 12, wherein the means for providing a variable supply voltage is configured to receive a voltage boost circuit input signal, the voltage boost circuit input signal comprising a multiple-bit representation of the audio input signal and a voltage headroom value.

15. The device of claim 14, wherein the multiple-bit representation of the audio input signal and the voltage headroom value comprises 8-bits.

16. The device of claim 14, further comprising means for providing a boost voltage for amplifying the audio input signal in addition to a fixed voltage when the output of the amplifying means exceeds a threshold.

17. The device of claim 16, further comprising means for varying a rate of decay with which the variable supply voltage follows the output of the amplifying means.

18. The device of claim 17, wherein the means for varying the rate of decay allows the variable supply voltage to adjustably follow the output of the amplifying means.

19. The device of claim 18, further comprising means for counting configured to further adjustably control the rate of decay with which the variable supply voltage adjustably follows the output of the amplifying means.

20. A method for operating an amplifier, comprising:
    amplifying an audio input signal;
    providing a variable supply voltage for amplifying the audio input signal, the variable supply voltage continuously proportional to an audio input signal, the variable supply voltage configured to follow an amplified audio output signal with a programmable variable decay; and
    generating a control signal configured to control the variable supply voltage using the programmable variable decay.

21. The method of claim 20, further comprising providing a variable voltage headroom value between the variable supply voltage and the amplified audio output signal, the variable voltage headroom value being proportional to a magnitude of the audio input signal.

22. The method of claim 20, wherein the audio input signal is provided to the class-D amplifier and a voltage boost circuit input signal comprises a multiple-bit representation of the audio input signal and a voltage headroom value.

23. The method of claim 22, wherein the multiple-bit representation of the audio input signal and the voltage headroom value comprises 8-bits.

24. The method of claim 22, further comprising providing a boost voltage for amplifying the audio input signal in addition to a fixed voltage when the amplified audio output signal exceeds a threshold.

25. The method of claim 20, wherein the programmable variable decay allows the variable supply voltage to adjustably follow the amplified audio output signal.

26. The method of claim 25, further comprising adjustably controlling the programmable variable decay using a counter.

27. The method of claim 26, wherein adjustably controlling the programmable variable decay comprises lengthening a time during which the variable supply voltage follows the amplified audio output signal.

* * * * *